United States Patent [19]
Kim et al.

[11] Patent Number: 5,683,938
[45] Date of Patent: Nov. 4, 1997

[54] METHOD FOR FILLING CONTACT HOLES WITH METAL BY TWO-STEP DEPOSITION

[75] Inventors: Sang Young Kim; Yung Wook Song; Hun Do Kim, all of Seoul, Rep. of Korea

[73] Assignee: Hyundai Electronics Industries Co., Ltd., Kyoung Ki-Do, Rep. of Korea

[21] Appl. No.: 327,887

[22] Filed: Oct. 24, 1994

Related U.S. Application Data

[63] Continuation of Ser. No. 964,362, Oct. 21, 1992, abandoned.

[30] Foreign Application Priority Data

Oct. 21, 1991 [KR] Rep. of Korea ............... 91-18500

[51] Int. Cl.⁶ ................................................. H01L 21/28
[52] U.S. Cl. .................... 437/192; 437/195; 437/981
[58] Field of Search ................................. 437/192, 195, 437/189, 190, 981

[56] References Cited

U.S. PATENT DOCUMENTS

| | | | |
|---|---|---|---|
| 4,764,484 | 8/1988 | Mo | 437/203 |
| 4,804,560 | 2/1989 | Shioya et al. | 427/125 |
| 4,906,593 | 3/1990 | Shioya et al. | 437/192 |
| 4,956,313 | 9/1990 | Cote et al. | 437/195 |
| 4,987,099 | 1/1991 | Flanner | 437/245 |
| 5,000,818 | 3/1991 | Thomas et al. | 437/192 |
| 5,063,175 | 11/1991 | Broadbent | 437/195 |
| 5,069,749 | 12/1991 | Gutierrez | 437/192 |
| 5,071,789 | 12/1991 | Nakata | 437/192 |
| 5,084,414 | 1/1992 | Manley et al. | 437/192 |
| 5,100,817 | 3/1992 | Cederbaum et al. | 437/245 |
| 5,124,780 | 6/1992 | Sandhu et al. | 437/192 |
| 5,128,278 | 7/1992 | Harada et al. | 437/192 |
| 5,470,791 | 11/1995 | Suguro et al. | 437/192 |

FOREIGN PATENT DOCUMENTS

| | | | |
|---|---|---|---|
| 0165320 | 12/1981 | Japan | 437/189 |
| 0034929 | 2/1990 | Japan | 437/192 |
| 2-231714 | 9/1990 | Japan | |

OTHER PUBLICATIONS

S. Wolf, "Silicon Processing For The VLSI Era, vol. 2", Lattice Press, 1990, pp. 201–205.

*Primary Examiner*—John Niebling
*Assistant Examiner*—Thomas G. Bilodeau
*Attorney, Agent, or Firm*—Merchant, Gould, Smith, Edell, Welter & Schmidt, P.A.

[57] ABSTRACT

Method for filling contact holes with metals by two-step deposition of selective tungsten layer is disclosed. The selective tungsten thin films are deposited in two steps, thus maximizing the contact filling with tungsten, gaining a stability of metal wires with better step coverage, and enhancing the reliability on semiconductor element.

5 Claims, 3 Drawing Sheets

"PRIOR ART"

"PRIOR ART"

METHOD FOR FILLING CONTACT HOLES WITH METAL BY TWO-STEP DEPOSITION

This is a continuation of U.S. application Ser. No. 07/964,362 filed Oct. 21, 1992, now abandoned.

BACKGROUND OF THE INVENTION

1. Field of the Invention

This invention relates to a method for filling contact holes with metal in the process steps to fabricate highly-integrated semiconductor device, and more particularly, to a method for filling the contact holes with two-step deposition of the selective tungsten thin films to minimize their surface topography, thus achieving better step coverage of the metal layer.

2. Description of the Prior Art

Generally, as the contact size in semiconductor device is reduced, the aspect ratio of the contact hole becomes larger and as a result, metal with poor step coverage causes the reliability problem to the semiconductor device. To resolve this matter, chemical vapor deposition (CVD) method is attractive for filling the inside of contact holes with selective tungsten thin films, thus better improving the step coverage of metal layer. The CVD process, however, has a troublesome problem associated with the difference of surface topography in contact holes. In the case of filling the contact holes with the highest surface topography with the selective tungsten thin films, the films become overgrown at the contact holes with rather lower surface topography and circuit failure may result between metal wires. To avoid such disadvantage, it is inevitable for the holes with the lowest surface topography to be filled in the first place. Consequently, the aspect ratio of contact holes with the highest step coverage cannot be significantly improved and this unfavorable situation is expected to continue thereafter, as the semiconductor elements become highly integrated and smaller.

It is a principle object of the present invention, therefore, to provide a contact-filling method, in which the selective tungsten thin films are deposited in two steps, thus maximizing the contact filling with tungsten, gaining a stability of metal wires with better step coverage, and enhancing the reliability on semiconductor elements.

The above-said objective should be construed as only one of many possible through the utilization of a few of the more practical and important features and applications of the invention. Many other beneficial results can be obtained by applying the disclosed invention in a different manner or modifying the invention within the scope of the disclosure. Accordingly, other objectives and a fuller understanding of the invention may be had by referring to both the summary of the invention and the detailed description, below, which describe the preferred embodiments and describe the scope of the invention defined by the claims, whose summary and description should be considered in conjunction with the accompanying drawings.

SUMMARY OF THE INVENTION

In order to prevent the metal layers from having poor step coverage due to the difference of surface topography in contact holes, the present invention is characterized by the fabrication steps as set forth hereunder:

As a first step, a field layer, a junction layer, and a gate electrode are formed on the upper part of silicon substrate, respectively. After depositing the first insulating layer over the upper part of the whole structure, the areas predetermined for the establishment of contact holes on the first-stage insulating layer are removed to form the first contact hole while both the junction layer on the lower part and the gate electrode are exposed;

The second step is to completely fill the contact holes with metal layers and the patterns of conductive layer is formed on the part of the first insulating layer isolated from said metal layers;

The third step is to form the second insulating layer on the upper part of the whole structure, whereby the areas prearranged for the establishment of contact holes on the second insulating layer are removed to form the second contact hole while both the metal layer on the lower part of the first contact hole and the patterns of conductive layer are exposed;

The last step is to fill the second contact hole with metal layers which is connected to the lower part of metal layer and the patterns of conductive layer.

The more practical and important features of the present invention have been outlined above in order that the detailed description of the invention which follows will be better understood and that the present contribution to the art can be fully appreciated. Additional features of the invention described hereinafter also form the subject matter of the claims of the invention. Those skilled in the art can appreciate that the conceptions and the specific embodiments disclosed herein may be readily utilized as bases for modifying or designing other structures for carrying out the same purposes as those of the present invention. Further, those skilled in the art can realize that such modified or newly-designed other structures do not depart from the spirit and scope of the invention as set forth in the claims.

BRIEF DESCRIPTION OF THE DRAWINGS

For a fuller understanding of the nature and object of the invention, reference should be made to the following Detailed Description of the Invention in conjunction with the accompanying drawings, a brief description of which drawings follow.

Figure 1A:
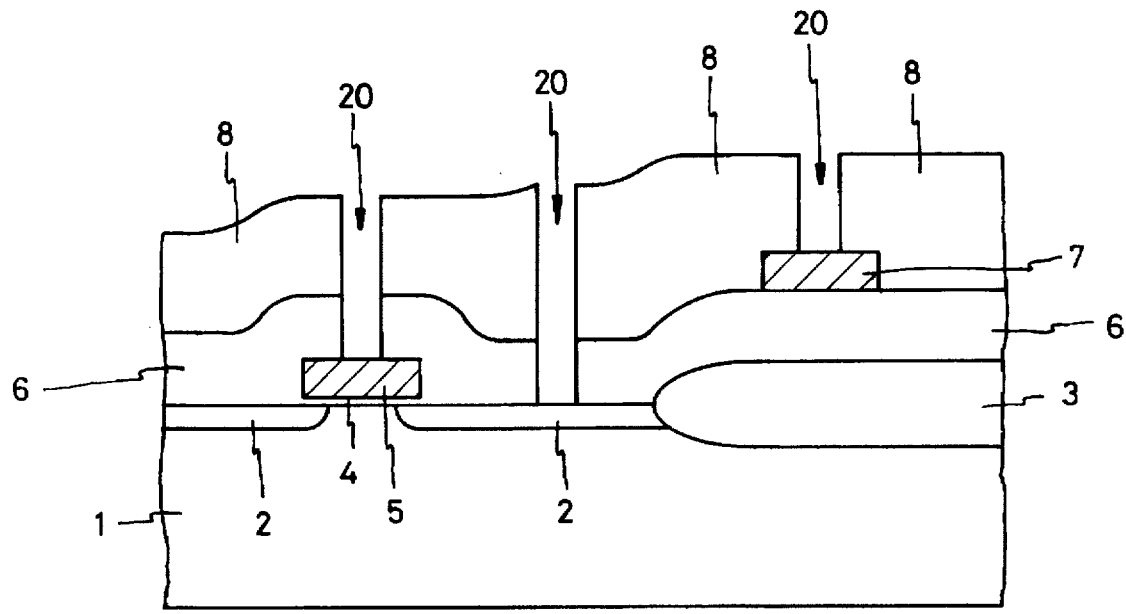
FIG. 1A and FIG. 1B are cross-sectional views illustrating that the contact holes in larger depth are unfilled due to the difference of their surface topography when they are formed in accordance with the prior art, and the selective tungsten thin films are deposited into the contact holes in a predetermined thickness.

The respective reference numerals noted in the detailed description of the invention below refer to the respective reference numerals relating to the pertinent drawing pairs and found as applicable throughout the several views of the drawings.

DETAILED DESCRIPTION OF THE INVENTION

FIG. 1A is a cross-sectional view for fabricating the device with the following process steps. A field oxide layer 3 is deposited on the surface of silicon substrate 1 to give isolation region among the elements, and a N+ or P+ junction layer 2 is formed on the silicon substrate. Next, after growing a gate oxide layer 4, a polysilicon is formed as a gate electrode 5. The first insulating oxide layer 6 is deposited on the upper part of the whole structure, and a polysilicon 7 for wiring is formed on the areas predetermined for the establishment of contact holes. Next, after depositing the second insulating oxide layer(8) on the upper part of the whole structure, the pattern process using a photoresist film is employed to form the contact holes at the predetermined areas between the first insulating layer 6 and the second insulating layer 8.

Figure 1B:
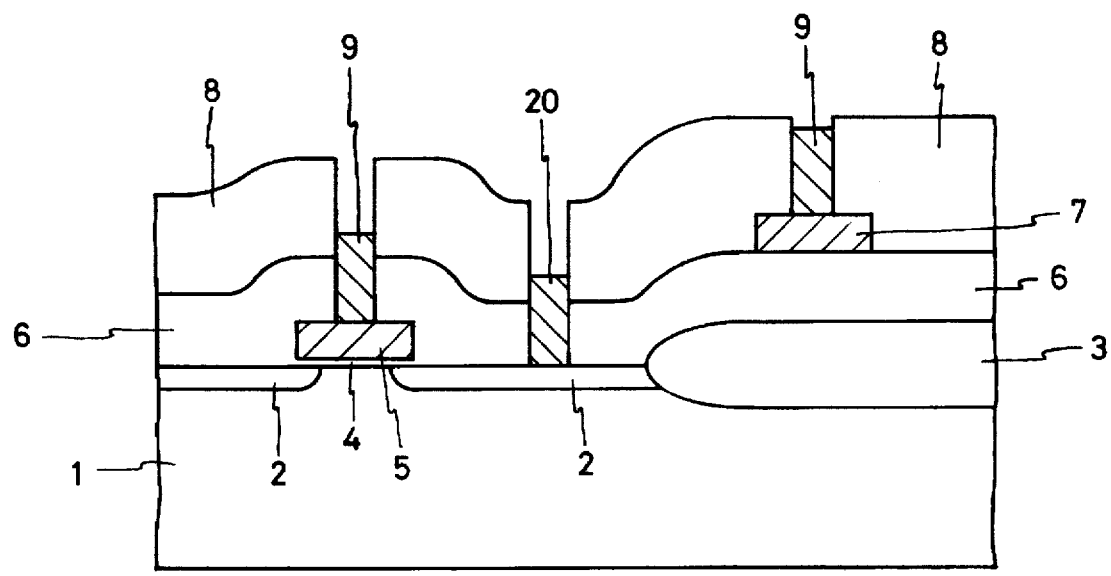

FIG. 1B is a cross-sectional view, as shown in FIG. 1A, to illustrate that deeper contact holes 20 are unfilled due to the difference of their surface topography, when the contact holes 20 are formed in accordance with the prior art and the selective tungsten thin films are deposited to the shallowest holes.

FIG. 2A through FIG. 2D are cross-sectional views illustrating that the contact holes are formed in two steps in accordance with the process steps of the present invention and the two-step deposit is made available by the selective tungsten thin layers.

Figure 2A:
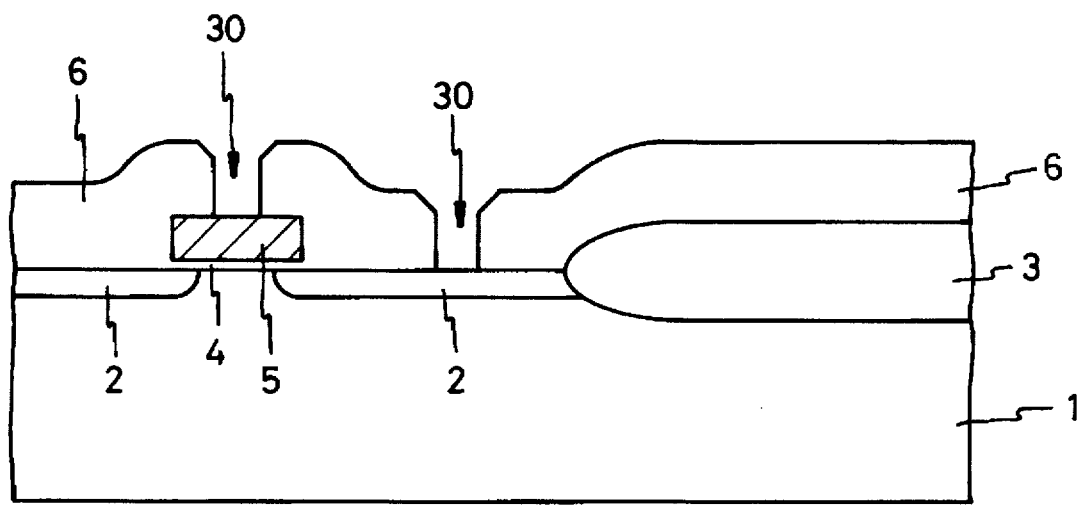
FIG. 2A through FIG. 2D are cross-sectional views illustrating that contact holes are formed in two step in accordance with the process steps of the present invention and two-step deposition is made available by the selective tungsten thin layers.

FIG. 2A is a cross-sectional view for fabricating the device with the following process steps. After growing a field oxide layer 3 and a gate oxide layer 4 on the silicon substrate 1, a N+ or P+ junction layer 2 is formed. A gate electrode 5 is formed on the upper part of a gate oxide layer 4, and the first insulating oxide layer 6 is deposited on the whole structure. The prior art covers the above process steps. In the next process, a photoresist film is used to form the contact pattern mask, the first insulating oxide layer 6 exposed hereto is etched by wet and/or dry etching, and the first contact hole 30 is formed while the gate electrode 5 and N+ or P+ junction 2 are exposed.

Figure 2B:
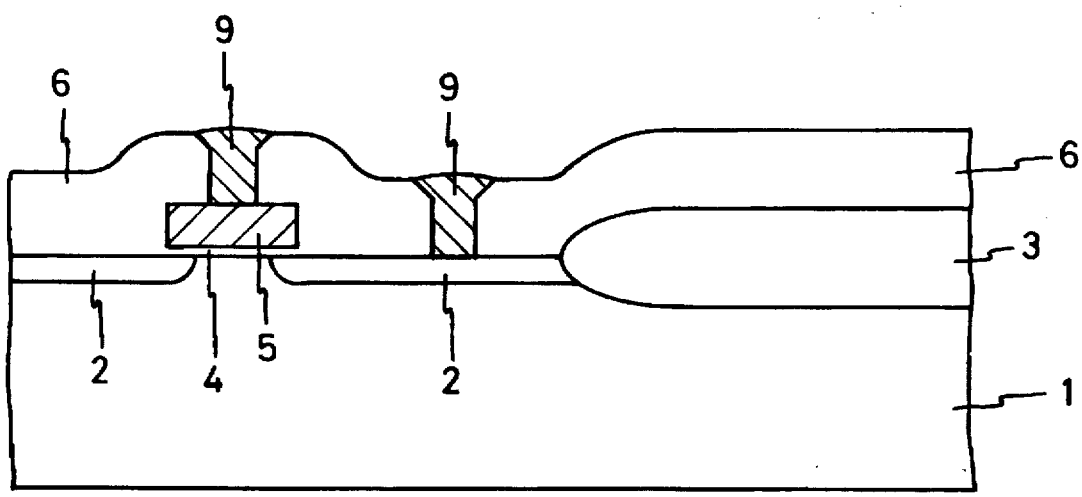

FIG. 2B is a cross-sectional view illustrating that the first contact hole 30, as fabricated in FIG. 2A, is filled with the selective tungsten thin films 9 by the CVD method. The selective tungsten thin films 9 fill the first contact hole 30, the selective films are overgrown appropriately to prevent misalignment with a second contact hole to be formed above the first contact hole.

Figure 2C:
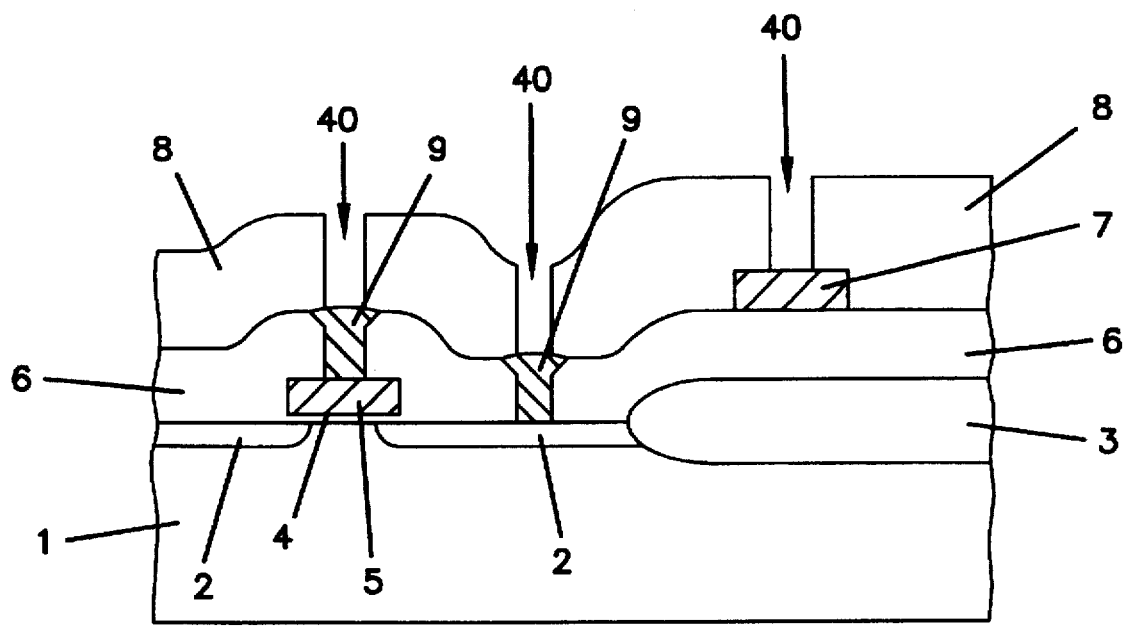

FIG. 2C is a cross-sectional view illustrating that a polysilicon 7 for wiring is placed on the areas predetermined for the establishment of contact holes on the upper part of the first insulating layer 6. After depositing the second insulating oxide layer 8 on the upper part of the whole structure, the etching by the contact pattern mask is made to the second insulating layer 8 placed on the first contact hole 30 and the polysilicon 7 for wiring to form a second contact hole 40 over each of the first contact hole and the polysilicon 7.

Figure 2D:
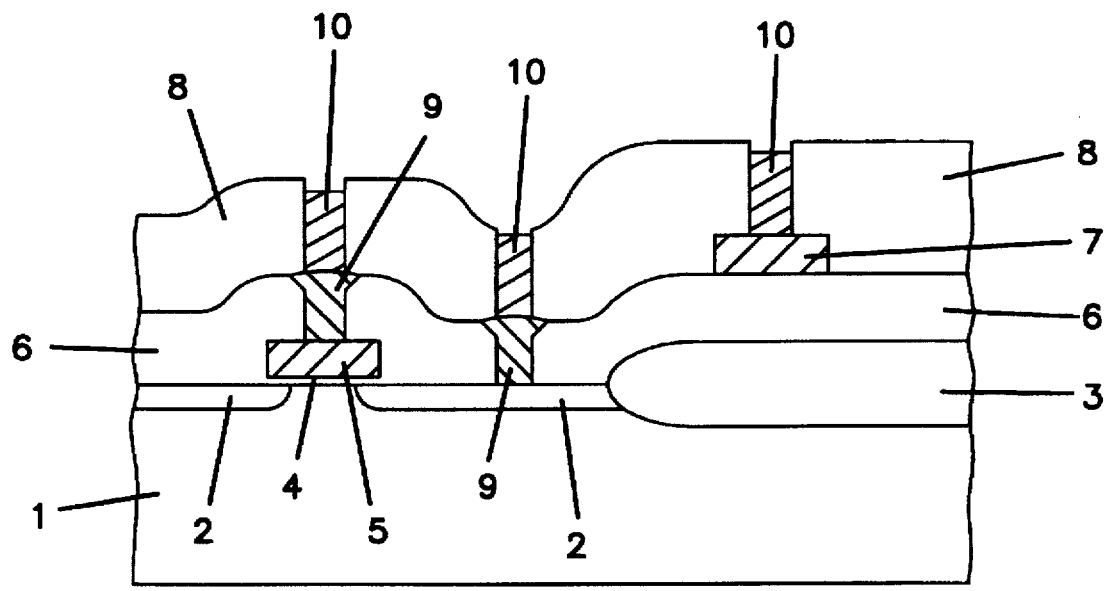

FIG. 2D is a cross-sectional view illustrating that the second contact hole 40 above the first contact hole 30, as fabricated in FIG. 2C, is almost filled by the CVD method with selective tungsten thin films 10 in contact with the selective tungsten thin films 9 of the first contact hole 30, and that the second contact hole 40 above the polysilicon 7 is simultaneously almost filled with selective tungsten thin films 10 by the CVD method.

As described above, the object of the present invention is to provide a method for filling the contact holes which have a rough surface topography with metal layers, in which, the first insulating oxide layer is provided. The tungsten thin films are deposited in the first contact hole and on the upper part, the second insulating oxide layer is formed. Next, the second contact hole is formed on the upper part of the first contact hole and on the areas predetermined for the establishment of the contact holes. Then, the second contact hole becomes almost filled with the selective tungsten thin films, thus achieving better step coverage of metal wire at the contact holes.

Although this invention has been described in its preferred forms with a certain degree of particularity, it will be appreciated by those skilled in the art that the present disclosure of the preferred forms has been effected only by way of example, and that numerous changes in the details of the construction, combination and arrangement of parts may be resorted to without departing from the spirit and scope of the invention.

What is claimed is:

1. A method for filling contact holes with metal by two-step deposition of metal layers, said method comprising the steps of:

providing a silicon substrate;

forming a field oxide layer and a junction layer and gate electrode on said silicon substrate;

forming a first insulating layer on exposed portions of the field oxide layer, the junction layer, and the gate electrode;

forming first plurality of contact holes of substantially equal depth by removing portions of the first insulating layer to expose said junction layer and said gate electrode, respectively the first plurality of contact holes having a tapered upper portion;

filling a first metal layer into the first plurality of contact holes, entirely, the first metal layer being grown over and extending slightly beyond said first plurality of contact holes;

forming a conductive layer pattern on the first insulating layer spaced from said first metal layer;

forming a second insulating layer on exposed portions of the conductive layer pattern, the first insulating layer, and the first plurality of contact holes;

forming second plurality of contact holes of substantially equal depth by removing portions of said second insulating layer to expose both the first metal layer and the conductive layer pattern, respectively and filling a second metal layer into said second plurality of contact holes to contact the first metal layer and the conductive layer pattern, respectively.

2. A method according to claim 1, wherein the first metal layer and subsequently the second metal layer are formed by chemical vapor deposition method.

3. A method according to claim 1, wherein the second metal layer filled in each of the second plurality of contacts holes has substantially equal depth.

4. A method according to claim 1, wherein the first and second metal layers are selective tungsten layers, respectively, and the first and second plurality of contact holes are filled with the first and second metal layers of the selected tungsten layers, respectively.

5. A method for filling contact holes with metal by a two-step deposition of metal layers, said method comprising the steps of:

providing a silicon substrate;

forming a field oxide layer and a junction layer and gate electrode on said silicon substrate;

forming a first insulating layer on exposed portions of the field oxide layer, the junction layer, and the gate electrode;

forming first plurality of contact holes of substantially equal depth by removing portions of the first insulating layer to expose said junction layer and said gate electrode, respectively the first plurality of contact holes having a tapered upper portion;

filling a first metal layer into entire first plurality of contact holes by one single step, the first metal layer being grown over and extending slightly beyond said first plurality of contact holes;

forming a conductive layer pattern on the first insulating layer spaced from said first metal layer;

forming a second insulating layer on exposed portions of the conductive layer pattern, the first insulating layer, and the first plurality of contact holes;

forming second plurality of contact holes of substantially equal depth by removing portions of said second insulating layer to expose both the first metal layer and the conductive layer pattern, respectively and filling a second metal layer into said second plurality of contact holes to contact the first metal layer and the conductive layer pattern, respectively.

* * * * *